(12) United States Patent
Jeon et al.

(10) Patent No.: US 10,074,674 B2
(45) Date of Patent: Sep. 11, 2018

(54) DISPLAY DEVICE CAPABLE OF REDUCING DAMAGE FROM STATIC ELECTRICITY

(71) Applicant: Samsung Display Co., Ltd., Yongin-si (KR)

(72) Inventors: Yong Chan Jeon, Cheonan-si (KR); Pil Gyu Kang, Hwaseong-si (KR); Hyun-Woong Baek, Seoul (KR); Hyung Joo Jeon, Suwon-si (KR); Sol Ip Jeong, Namyangju-si (KR); Jang-Bog Ju, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/784,545

(22) Filed: Oct. 16, 2017

(65) Prior Publication Data

US 2018/0108683 A1 Apr. 19, 2018

(30) Foreign Application Priority Data

Oct. 17, 2016 (KR) .................. 10-2016-0134379

(51) Int. Cl.
| | | |
|---|---|---|
| *H01L 27/12* | (2006.01) | |
| *H01L 23/60* | (2006.01) | |
| *G02F 1/1362* | (2006.01) | |
| *H01L 27/32* | (2006.01) | |

(52) U.S. Cl.
CPC .......... *H01L 27/1244* (2013.01); *H01L 23/60* (2013.01); *H01L 27/1255* (2013.01); *G02F 1/136204* (2013.01); *G02F 1/136286* (2013.01); *G02F 2001/13629* (2013.01); *H01L 27/3276* (2013.01); *H01L 2251/5392* (2013.01)

(58) Field of Classification Search
CPC . H01L 23/60; H01L 27/1244; H01L 27/1255; H01L 27/3276; H01L 2251/5392; G02F 1/136204; G02F 1/136286
See application file for complete search history.

(56) References Cited

U.S. PATENT DOCUMENTS

| | | |
|---|---|---|
| 2013/0120334 A1 | 5/2013 | Kim et al. |
| 2015/0171155 A1 | 6/2015 | Yun et al. |

(Continued)

FOREIGN PATENT DOCUMENTS

| | | |
|---|---|---|
| KR | 10-2013-0051806 | 5/2013 |
| KR | 10-2014-0032762 | 3/2014 |
| KR | 10-2015-0033158 | 4/2015 |

(Continued)

*Primary Examiner* — Hoai V Pham
(74) *Attorney, Agent, or Firm* — H.C. Park & Associates, PLC

(57) ABSTRACT

A display device includes: a first substrate; a second substrate facing the first substrate; a first electrode disposed on a first surface of the first substrate, the first surface facing the second substrate; a second electrode and a third electrode disposed along an edge of a second surface of the second substrate, the second surface facing the first surface of the first substrate; and a short electrode disposed between the first electrode and the second electrode and between the first electrode and the third electrode, the short electrode electrically connecting the first electrode, the second electrode, and the third electrode, wherein the second electrode and the third electrode are physically separated.

17 Claims, 7 Drawing Sheets

(56) References Cited

U.S. PATENT DOCUMENTS

2015/0187750 A1 7/2015 Kim et al.
2017/0192322 A1* 7/2017 Jung ................ G02F 1/133345

FOREIGN PATENT DOCUMENTS

| KR | 10-2015-0071350 | 6/2015 |
| KR | 10-2015-0076405 | 7/2015 |
| KR | 10-2016-0036933 | 4/2016 |
| KR | 10-2016-0080360 | 7/2016 |

* cited by examiner

DISPLAY DEVICE CAPABLE OF REDUCING DAMAGE FROM STATIC ELECTRICITY

CROSS-REFERENCE TO RELATED APPLICATION

This application claims priority from and the benefit of Korean Patent Application No. 10-2016-0134379, filed on Oct. 17, 2016, which is hereby incorporated by reference for all purposes as if fully set forth herein.

BACKGROUND

Field

Exemplary embodiments of the of the inventive concepts relate to a display device that prevents or reduces static electricity.

Discussion of the Background

Recently, various display devices, such as liquid crystal displays and organic light emitting diode displays, have been commercially available.

Such display devices may include a display panel in which a plurality of pixels and wires are disposed on an insulation substrate. The display panel includes a display area where the plurality of pixels are disposed to display an image, and a peripheral area where pads and wires to supply power to the display area are disposed.

As the plurality of pixels, as well as the pads and the wires to supply the power, are formed on the insulation substrate, static electricity generated within the display panel may not be dispersed through the insulation substrate and may flow into the display area through the wires disposed in the peripheral area, thereby damaging an insulating layer or a thin film transistor of the pixel. The display panel may be vulnerable to the static electricity, and such static electricity may generate a defect in the display panel.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a display device capable of preventing or reducing damage from static electricity and resulting defects in the display device due to external material penetration.

An exemplary embodiment discloses a display device including: a first substrate; a second substrate facing the first substrate; a first electrode disposed on a first surface of the first substrate, the first surface facing the second substrate; a second electrode and a third electrode disposed along an edge of a second surface of the second substrate, the second surface facing the first surface of the first substrate; and a short electrode disposed between the first electrode and the second electrode and between the first electrode and the third electrode, the short electrode electrically connecting the first electrode, the second electrode, and the third electrode, wherein the second electrode and the third electrode are physically separated.

A gap may be formed between the second electrode and the third electrode, and the gap may extend along an edge of the first substrate.

The third electrode may be disposed closer to the edge of the second substrate than the second electrode.

The short electrode may overlap a part of the third electrode, and rest of the third electrode may not overlap the short electrode.

The short electrode may be disposed along the edge of the first substrate.

A first reference voltage wire may be disposed on the second surface of the second substrate, and the first reference voltage wire may be electrically connected to the second electrode.

The first reference voltage wire may be disposed along the edges of the first substrate.

A reference voltage of a predetermined level may be applied to the first reference voltage wire.

The first reference voltage wire may be connected to a ground voltage.

An insulating layer may be disposed between the first reference voltage wire and the second electrode, and the insulating layer may include a contact hole overlapping the first reference voltage wire, wherein the second electrode may be physically in contact with the first reference voltage wire through the contact hole.

A second reference voltage wire overlapping the second electrode and the insulating layer may be interposed therebetween.

A third reference voltage wire overlapping the third electrode and the insulating layer may be interposed therebetween.

The second reference voltage wire and the third reference voltage wire may be physically separated from the first reference voltage wire.

The second reference voltage wire and the second electrode may form a first capacitor.

The third reference voltage wire and the third electrode may form a second capacitor.

The first electrode may be disposed covering the entirety of the first surface of the first substrate.

An exemplary embodiment also discloses a display device including: a first substrate; a second substrate facing the first substrate; a first electrode disposed on a first surface of the first substrate, the first surface facing the second substrate; a second electrode and a third electrode disposed along an edge of a second surface of the second substrate, the second surface facing the first surface of the first substrate; and a conductor disposed between the first electrode and the second electrode and between the first electrode and the third electrode, the short electrode electrically connecting the first electrode, the second electrode, and the third electrode, wherein a gap is formed between the second electrode and the third electrode, and the gap extends along an edge of the first substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
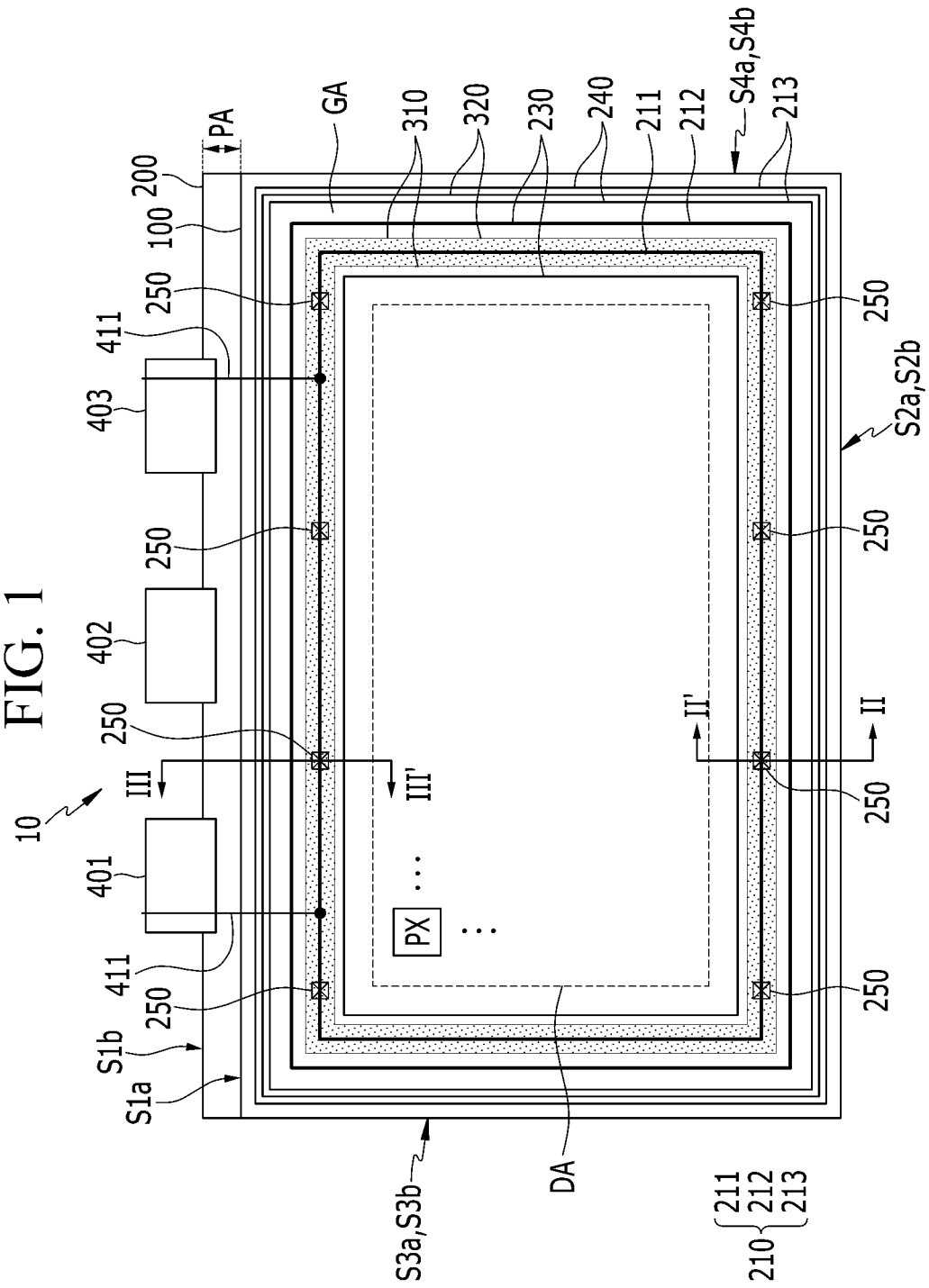
FIG. 1 is a top plan view schematically showing a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not necessarily intended to illustrate the actual shape of a region of a device and are not intended to be limiting.

Figure 2:
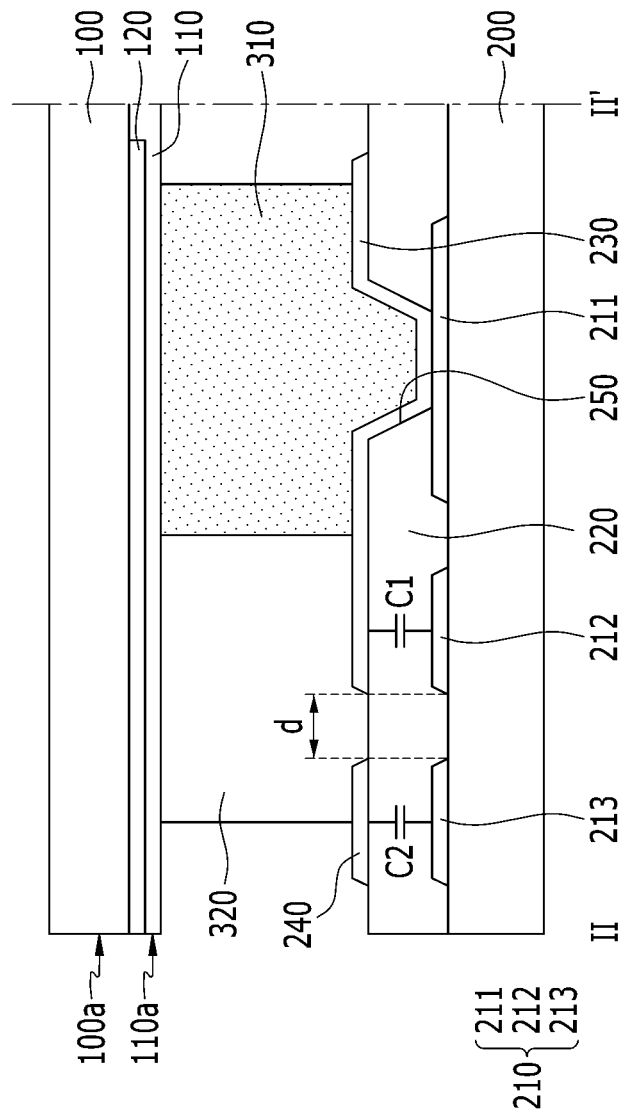
FIG. 2 is a cross-sectional view of the display device of FIG. 1 taken along a sectional line II-II'.
Figure 3:
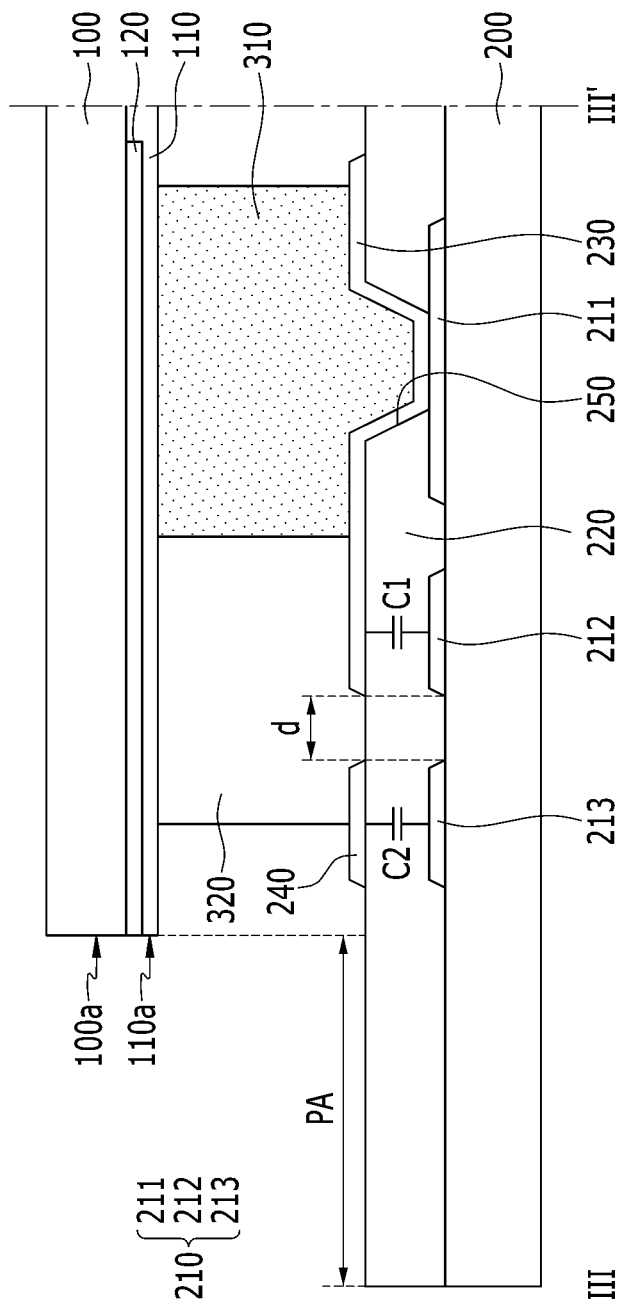
FIG. 3 is a cross-sectional view of the display device of FIG. 1 taken along a sectional line III-III'.
Figure 4:
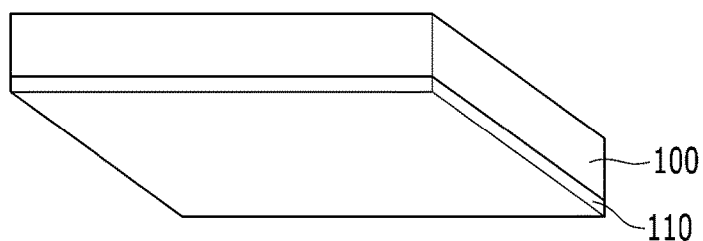
FIG. 4 is a perspective view of a first substrate and a first electrode of a display device according to an exemplary embodiment of FIG. 1.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein FIG. 1 is a top plan view schematically showing a display device according to an exemplary embodiment. FIG. 2 is a cross-sectional view of the display device of FIG. 1 taken along a sectional line II-II'. FIG. 3 is a cross-sectional view of the display device of FIG. 1 taken along a sectional line III-III'. FIG. 4 is a perspective view of a first substrate and a first electrode of a display device according to an exemplary embodiment of FIG. 1.

Referring to FIGS. 1, 2, 3, and 4, the display device 10 includes a first substrate 100, a second substrate 200, a first electrode 110, a second electrode 230, a third electrode 240, a short electrode 320, and first, second, and third driving circuit units 401, 402, and 403.

The first substrate 100 is disposed facing the second substrate 200, and the first substrate 100 and the second substrate 200 are disposed overlapping each other. The first substrate 100 may be an upper substrate, and the second substrate 200 may be a lower substrate. The first substrate 100 and the second substrate 200 may be transparent insulators made of glass or plastic.

The first substrate 100 may include four sides S1a, S2a, S3a, and S4a. The four sides S1a, S2a, S3a, and S4a of the first substrate 100 are edges of the first substrate 100. Also, the second substrate 200 may include four sides S1b, S2b, S3b, and S4b. The four sides S1b, S2b, S3b, and S4b of the second substrate 200 are edges of the second substrate 200. The first sides S1a and S1b respectively face the second sides S2a and S2b, and the third sides S3a and S3b respectively face the fourth sides S4a and S4b.

Three sides S2a, S3a, and S4a of the first substrate 100 and three sides S2b, S3b, and S4b of the second substrate 200 are disposed overlapping each other to be aligned in a cross-sectional direction. The third side S3b and the fourth side S4b of the second substrate 200 may be formed to be longer than the third side S3a and the fourth side S4a of the first substrate 100. Accordingly, the first side S1b of the second substrate 200 is disposed protruding passed the first side S1a of the first substrate 100, and the second substrate 200 is wider than the first substrate 100. Therefore, a region of the second substrate 200 adjacent to the first side S1b is not covered by the first substrate 100. The region of the second substrate 200 adjacent to the first side S1b that is wider than the first substrate 100 is a pad region PA for connection with the first, second, and third driving circuit units 401, 402, and 403. That is, all of the first substrate 100 overlaps with the second substrate 200 in the plan view, and the second substrate 200 may further include the pad region PA that does not overlap the first substrate 100 in the plan view.

The first electrode 110 is disposed on the first surface of the first substrate 100 facing the second substrate 200. Referring to FIG. 4, the first electrode 110 may be disposed on substantially the entirety of the first surface of the first substrate 100 facing the second substrate 200. An outermost portion 110a of the first electrode 110 may overlap an outermost portion 100a of the first substrate 100, thereby being aligned on a cross-section. The first electrode 110 may include a transparent conductor such as ITO (indium tin oxide) or IZO (indium zinc oxide).

A light blocking member 120 may be disposed along the edges of the first substrate 100 in the edge region of the first substrate 100. The light blocking member 120 may be disposed between the first substrate 100 and the first electrode 110 on a cross-section. The light blocking member 120 functions such that the second electrode 230, the third electrode 240, the sealant 310, and the short electrode 320 disposed between the first substrate 100 and the second substrate 200 are not recognized by a user.

The second electrode 230 and the third electrode 240 are disposed on the second substrate 200. In detail, the second electrode 230 and the third electrode 240 may be disposed on a second surface of the second substrate 200 facing the first surface of the first substrate 100, may be formed in the edge regions of the second substrate 200, and may extend along the edges of the second substrate 200. Hereafter, the top of the first substrate 100 means the top of the first surface, and the top of the second substrate 200 means the top of the second surface. The second electrode 230 and the third electrode 240 are mainly not disposed within the pad region PA, however a part of the third electrode 240 may be disposed on the pad region PA. The second electrode 230 and the third electrode 240 may extend along the first side S1a of the first substrate 100. That is, the second electrode 230 and the third electrode 240 may be disposed along the edges of the first substrate 100. The third electrode 240 may be disposed to be closer to the edge of the second surface of the second substrate 200 than the second electrode 230. The second electrode 230 and the third electrode 240 may include a conductor such as a metal material. Also, according to an exemplary embodiment, the second electrode 230 and the third electrode 240 may include the transparent conductor such as ITO or IZO.

The second electrode 230 and the third electrode 240 are physically separated via a gap GA in the plan view. In detail, referring to FIG. 2 and FIG. 3, the second electrode 230 and the third electrode 240 are disposed on the same layer in the plan view and may be disposed to be separated by a separation distance d. The gap GA may extend along the edges of the first substrate 100.

An insulating layer 220 and a reference voltage wire 210 may be disposed between the second substrate 200, and the second and third electrodes 230 and 240.

The insulating layer 220 is disposed between the reference voltage wire 210 and the second electrode 230. The reference voltage wire 210 includes a first reference voltage wire 211, a second reference voltage wire 212, and a third reference voltage wire 213. The reference voltage wire 210 is disposed on the second substrate 200, and the insulating layer 220 is disposed on the reference voltage wire 210. The reference voltage wire 210 may include the conductor such as the metal material.

The insulating layer 220 may include an inorganic insulating material or an organic insulating material. Referring to FIG. 2 and FIG. 3, the insulating layer 220 is formed of one layer, however the exemplary embodiments are not limited thereto, and the insulating layer 220 may be formed of a multi-layered structure of different insulating materials. The second electrode 230 and the third electrode 240 may be disposed on the insulating layer 220 to be physically separated in the same layer.

According to the exemplary embodiments, at least a part of the second electrode 230 and the third electrode 240 may be physically connected, with the gap GA disposed between the second electrode 230 and the third electrode 240 extending along the edges of the first substrate 100, so that rest of the second electrode 230 and the third electrode 240 are spaced apart from each other.

The insulating layer 220 may have a contact hole 250 overlapping the first reference voltage wire 211. The second electrode 230 is physically in contact with the first reference voltage wire 211 through the contact hole 250 to be electrically connected. A number of contact holes 250 overlapping the first reference voltage wire 211 is not limited to that shown in FIG. 1.

A sealant 310 to bond the first substrate 100 and the second substrate 200 may be disposed on the second electrode 230 disposed along the edges of the first substrate 100. The sealant 310 may overlap the second electrode 230 disposed along the edges of the first substrate 100 in the plan view. The sealant 310 has a function of sealing the inside between the first substrate 100 and the second substrate 200. The sealant 310 may include an insulator that does not conduct electricity. According to an exemplary embodiment, the sealant 310 may include a conductor that does conduct electricity.

A plurality of pixels PX are disposed within a region enclosed by the sealant 310. Each of the plurality of pixels PX may include at least one transistor and a pixel electrode disposed on the second substrate 200. The plurality of pixels PX may be substantially arranged in a matrix shape. Referring to FIG. 1, a region where the plurality of pixels PX are disposed in the plan view is referred to as a display area DA.

The first, second, and third driving circuit units 401, 402, and 403 are connected to the pad region PA of the second substrate 200. At least one of the first, second, and third driving circuit units 401, 402, and 403 may be connected to the first reference voltage wire 211 through a connection wire 411. A reference voltage of a predetermined level may be applied to the first reference voltage wire 211 thorough at least one of the first, second, and third driving circuit units 401, 402, and 403. The reference voltage may be a voltage that is a reference for gray display of the pixel PX. For example, the reference voltage may be the voltage of the same level as the data voltage of 0 grays. Also, according to an exemplary embodiment, the first reference voltage wire 211 may be connected to ground (not shown) through at least one of the first, second, and third driving circuit units 401, 402, and 403. Further, according to an exemplary embodiment, the first reference voltage wire 211 may be connected to the ground (not shown) provided in the second substrate 200, and in this case, the connection wire 411 may be omitted.

The first, second, and third driving circuit units 401, 402, and 403 may include an FPC (flexible printed circuit), and may be connected to the pad region PA of the second substrate 200 by an anisotropic conductive film (ACF). In FIG. 1, three driving circuit units including the first, second, and third driving circuit units 401, 402, and 403 are illustrated, however the exemplary embodiments are not limited thereto, and one, two, or more driving circuit units of the first, second, and third driving circuit units 401, 402, and 403 may be provided according to an exemplary embodiment. In addition, in FIG. 1, the case that the connection wire 411 is connected to the first driving circuit unit 401 and the third driving circuit unit 403 is illustrated, but the number and connection shape of the connection wire 411 are not limited thereto.

Referring to FIG. 1, in the plan view, the reference voltage wire 210 may be disposed along the edges of the first substrate 100. That is, the reference voltage wire 210 may extend along the first to fourth sides S1*a*, S2*a*, S3*a*, and S4*a* of the first substrate 100. In this case, the first reference voltage wire 211 may overlap the second electrode 230 and the sealant 310. The second reference voltage wire 212 may overlap one side of the second electrode 230 with the insulating layer 220 interposed therebetween. The third reference voltage wire 213 may overlap the third electrode 240 with the insulating layer 220 interposed therebetween.

According to an exemplary embodiment, the second reference voltage wire 212 and the third reference voltage wire 213 may be physically separated from the first reference voltage wire 211. Further, at least one of the second reference voltage wire 212 and the third reference voltage wire 213 may be electrically connected to the first reference voltage wire 211, thereby receiving the same reference voltage or being connected to ground.

The short electrode 320 is disposed between the first electrode 110 and the second and third electrodes 230 and 240. The short electrode 320 may include the conductor to electrically connect the first electrode 110, the second electrode 230, and the third electrode 240, and the conductor may be anisotropic. The first electrode 110 and the second electrode 230 are electrically connected through the short electrode 320, and therefore, the first electrode 110 and the first reference voltage wire 211 are electrically connected. Also, the first electrode 110 and the third electrode 240 are electrically connected through the short electrode 320, and therefore, the second electrode 230 and the third electrode 240 are electrically connected.

The short electrode 320 may be disposed along the edges of the first substrate 100 near the sealant 310. The short electrode 320 may be disposed to be closer to the edge of the first substrate 100 than the sealant 310. The short electrode 320 may overlap the part of the second electrode 230 that does not overlap the sealant 310 and the third electrode 240 in the plan view. In this case, the short electrode 320 overlaps the gap GA between the second electrode 230 and the third electrode 240 in the plan view, thereby covering the gap GA. The short electrode 320 may overlap at least a part of the third electrode 240 and may not overlap rest of the third electrode 240. According to the exemplary embodiments, the short electrode 320 may overlap most of the third electrode 240 to cover it.

Referring to FIG. 3, the second substrate 200 may be extended by the pad region PA compared with the first substrate 100 and the insulating layer 220 is disposed in the pad region PA, however the second electrode 230 and the third electrode 240 may not be disposed therein. Also, the short electrode 320 is not disposed in the pad region PA.

The static electricity generated from the external surface of the first substrate 100 may be transmitted to the first electrode 110 along the external surface of the first substrate 100. The static electricity flowing into the first electrode 110 does not flow to the display area DA side but flows to the second electrode 230 through the short electrode 320 disposed on the edge of the first substrate 100, thereby escaping through the first reference voltage wire 211 connected to the second electrode 230.

In addition, as the second reference voltage wire 212 overlaps the second electrode 230 via the insulating layer 220, the second reference voltage wire 212 and the second electrode 230 may form a first capacitor C1. Furthermore, as the third reference voltage wire 213 overlaps the third electrode 240 via the insulating layer 220, the third reference voltage wire 213 and the third electrode 240 may form a second capacitor C2. Accordingly, the static electricity flowing to the second electrode 230 and the third electrode 240 through the short electrode 320 are respectfully charged to the first capacitor C1 and the second capacitor C2, thereby minimizing the static electricity flow into the display area DA.

As described above, as the second electrode 230 and the third electrode 240 include the parts that are separated via the gap GA, even if the third electrode 240 is exposed to an external high temperature and high humidity environment and is corroded, the second electrode 230 that is physically separated from the third electrode 240 may not be affected by corrosion of the third electrode 240. That is, among the second electrode 230 and the third electrode 240 disposed to be adjacent to the edge of the first substrate 100 of the display device for the static electricity prevention, the corrosion due to the high temperature and high humidity environment is limited to the third electrode 240 and the corrosion is not spread to the display area DA enclosed by the sealant 310, thereby reducing the defects of the display device.

Next, a display device according to another exemplary embodiment will be described with reference to FIGS. 5, 6, and 7. The display device according to the exemplary embodiment illustrated in FIGS. 5, 6, and 7 may be described in comparison with the display device according to the exemplary embodiment described in FIGS. 1, 2, 3, and 4.

Figure 5:
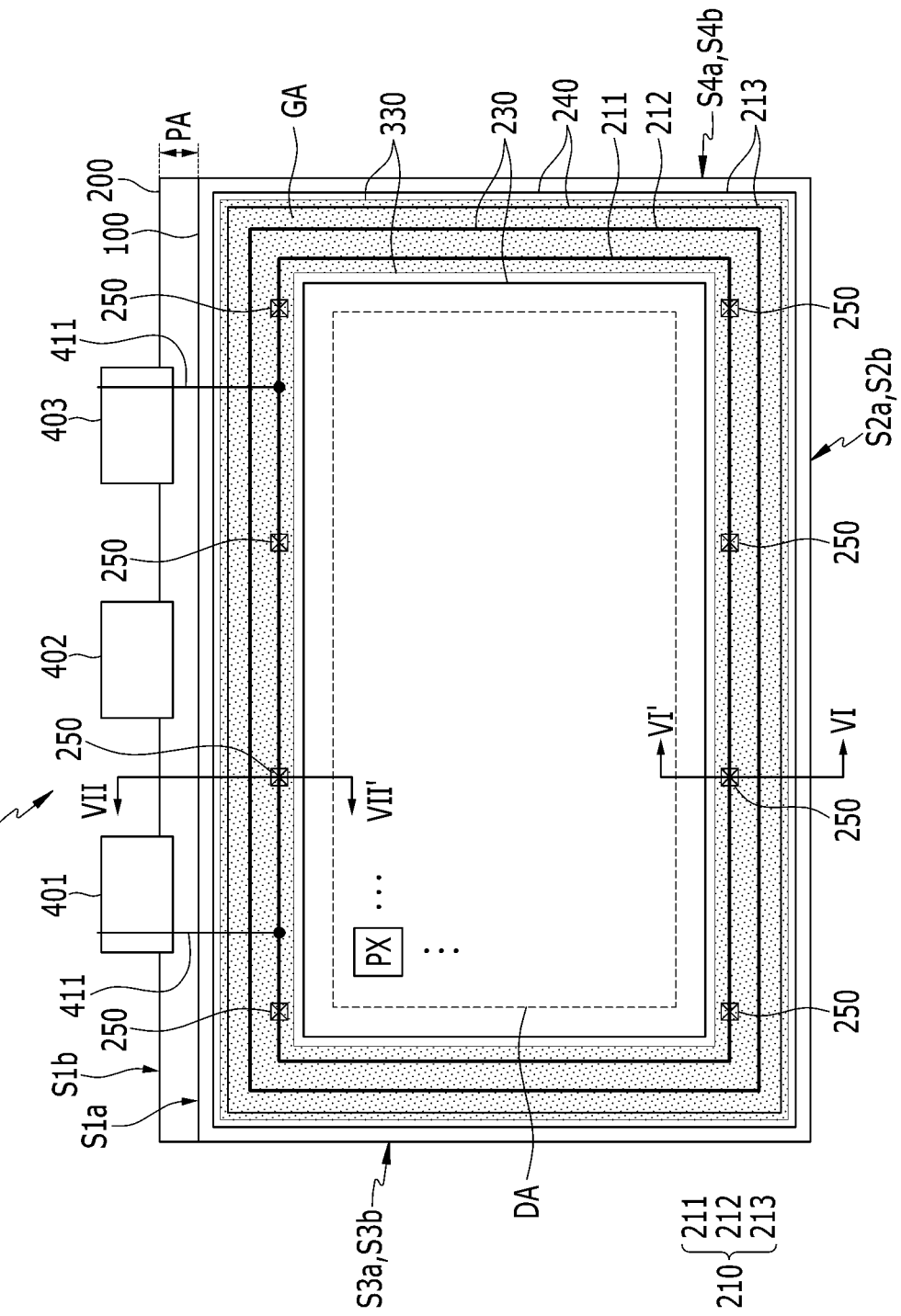
FIG. 5 is a top plan view schematically showing a display device according to another exemplary embodiment.

FIG. 5 is a top plan view schematically showing a display device according to another exemplary embodiment. FIG. 6 is a cross-sectional view of the display device of FIG. 5 taken along a sectional line VI-VI'. FIG. 7 is a cross-sectional view of the display device of FIG. 5 taken along a sectional line VII-VII'.

Figure 6:
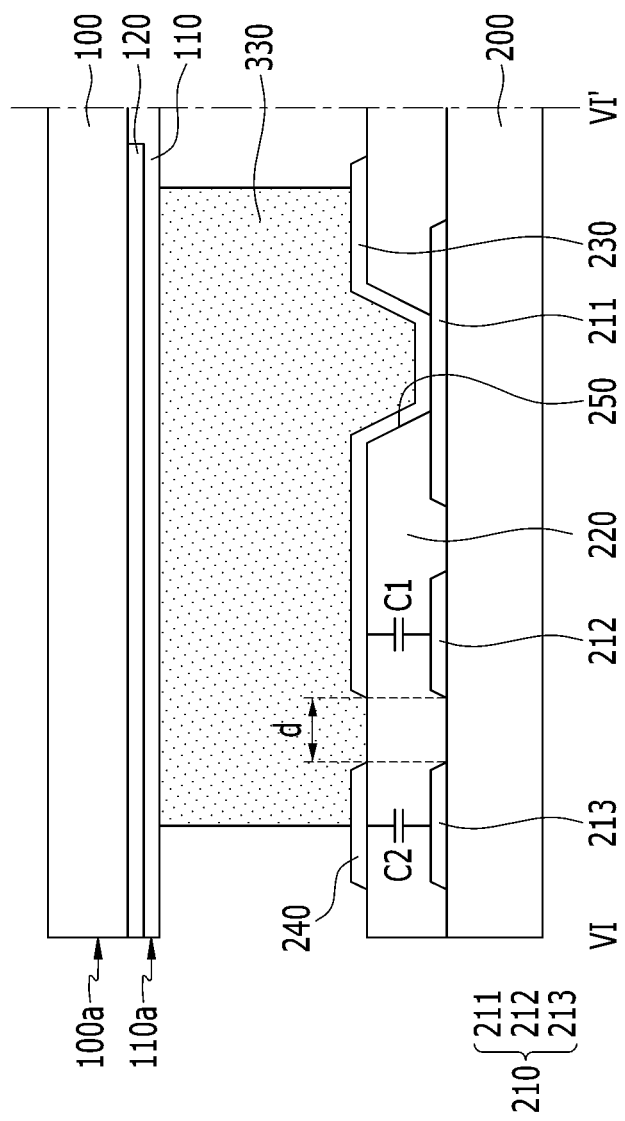
FIG. 6 is a cross-sectional view of the display device of FIG. 5 taken along a sectional line VI-VI'.
Figure 7:
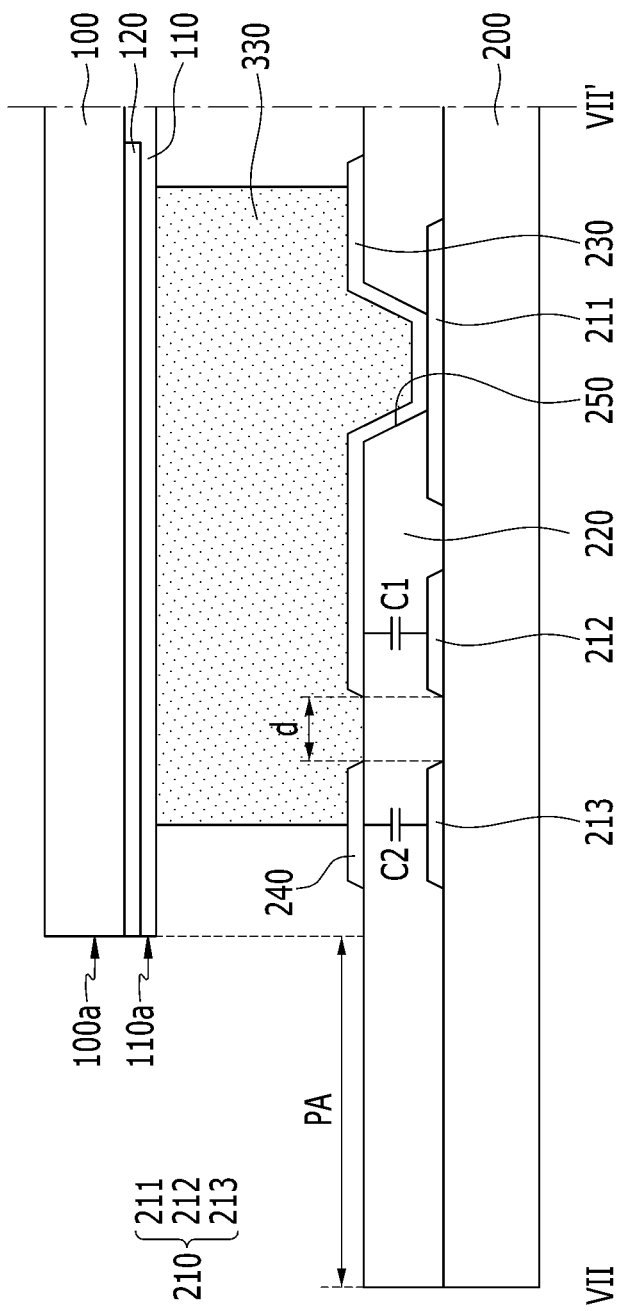
FIG. 7 is a cross-sectional view of the display device of FIG. 5 taken along a sectional line VII-VII'.

Referring to FIGS. 5, 6, and 7, a conductive sealant 330 is disposed on the second electrode 230 and the third electrode 240. The conductive sealant 330 may be disposed instead of the sealant 310 and the short electrode 320 in the exemplary embodiment of FIGS. 1, 2, 3, and 4. That is, while the conductive sealant 330 is disposed between the first electrode 110, and the second electrode 230 and the third electrode 240, and encapsulates the inside between the first substrate 100 and the second substrate 200, the conductive sealant 330 may electrically connect the first electrode 110, the second electrode 230, and the third electrode 240. The conductive sealant 330 may overlap the second electrode 230 and the third electrode 240 and may overlap the gap GA between the second electrode 230 and the third electrode 240, thereby covering the gap GA.

Except for the differences, the characteristics of the exemplary embodiment described with reference to FIGS. 1, 2, 3, and 4 may all be applied to the exemplary embodiment described with reference to FIGS. 5, 6, and 7 such that the description of the characteristics of the exemplary embodiment described with reference to FIGS. 1, 2, 3, and 4 are omitted.

According to an exemplary embodiment of the present disclosure, the static electricity does not flow into the display device, and therefore, the defect of the display device may be prevented or reduced, and the failure of the display device due to external material penetration may be prevented or reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a first substrate;
a second substrate facing the first substrate;
a first electrode disposed on a first surface of the first substrate, the first surface facing the second substrate;
a second electrode and a third electrode disposed along an edge of a second surface of the second substrate, the second surface facing the first surface of the first substrate; and
a short electrode disposed between the first electrode and the second electrode and between the first electrode and the third electrode, the short electrode electrically connecting the first electrode, the second electrode, and the third electrode,
wherein the second electrode and the third electrode are physically separated.

2. The display device of claim 1, wherein
a gap is formed between the second electrode and the third electrode, and
the gap extends along an edge of the first substrate.

3. The display device of claim 2, wherein
the third electrode is disposed closer to the edge of the second substrate than the second electrode.

4. The display device of claim 3, wherein
the short electrode overlaps a part of the third electrode, and rest of the third electrode does not overlap the short electrode.

5. The display device of claim 3, wherein
the short electrode is disposed along the edge of the first substrate.

6. The display device of claim 3, further comprising
a first reference voltage wire disposed on the second surface of the second substrate, the first reference voltage wire electrically connected to the second electrode.

7. The display device of claim 6, wherein
the first reference voltage wire is disposed along the edge of the first substrate.

8. The display device of claim 6, wherein
a reference voltage of a predetermined level is applied to the first reference voltage wire.

9. The display device of claim 6, wherein
the first reference voltage wire is connected to a ground voltage.

10. The display device of claim 6, further comprising
an insulating layer disposed between the first reference voltage wire and the second electrode, the insulating layer comprising a contact hole overlapping the first reference voltage wire,
wherein the second electrode is physically in contact with the first reference voltage wire through the contact hole.

11. The display device of claim 10, further comprising:
a second reference voltage wire overlapping the second electrode with the insulating layer interposed therebetween.

12. The display device of claim 11, further comprising:
a third reference voltage wire overlapping the third electrode with the insulating layer interposed therebetween.

13. The display device of claim 12, wherein
the second reference voltage wire and the third reference voltage wire are physically separated from the first reference voltage wire.

14. The display device of claim 13, wherein
the second reference voltage wire and the second electrode form a first capacitor.

15. The display device of claim 13, wherein
the third reference voltage wire and the third electrode form a second capacitor.

16. The display device of claim 1, wherein
the first electrode is disposed covering an entirety of the first surface of the first substrate.

17. A display device comprising
a first substrate;
a second substrate facing the first substrate;
a first electrode disposed on a first surface of the first substrate, the first surface facing the second substrate;
a second electrode and a third electrode disposed along an edge of a second surface of the second substrate, the second surface facing the first surface of the first substrate; and a conductor disposed between the first electrode and the second electrode and between the first electrode and the third electrode, the conductor electrically connecting the first electrode, the second electrode, and the third electrode, wherein a gap is formed between the second electrode and the third electrode, and the gap extends along an edge of the first substrate.

* * * * *